United States Patent [19]

den Hollander

[11] 4,117,380

[45] Sep. 26, 1978

[54] TRANSFORMER ARRANGEMENT FOR SYNCHRONOUSLY SWITCHED VERTICAL DEFLECTION SYSTEM

[75] Inventor: Willem den Hollander, Schlieren, Switzerland

[73] Assignee: RCA Corporation, New York, N.Y.

[21] Appl. No.: 824,101

[22] Filed: Aug. 12, 1977

[30] Foreign Application Priority Data

Nov. 15, 1976 [GB] United Kingdom ............... 47545/76

[51] Int. Cl.² .................. H01J 29/70; H01J 29/76
[52] U.S. Cl. .................................. 315/393; 315/399; 315/408
[58] Field of Search ............... 315/393, 399, 387, 388, 315/408, 370, 391, 378; 307/228; 328/187; 336/197, 221

[56] References Cited

U.S. PATENT DOCUMENTS

| 3,132,284 | 5/1964 | Brooks | 336/197 |
| 3,824,427 | 7/1974 | McLeod, Jr. | 315/387 |
| 4,048,544 | 9/1977 | Haferl | 315/408 |

Primary Examiner—Nelson Moskowitz
Assistant Examiner—Lawrence Goodwin
Attorney, Agent, or Firm—Eugene M. Whitacre; Paul J. Rasmussen; William H. Meise

[57] ABSTRACT

A horizontal deflection circuit drives a voltage generator by way of a first transformer, and also drives a switched synchronous vertical deflection circuit. In order to reduce variations of the energy coupled from the horizontal deflection circuit to the vertical deflection circuit attributable to variation of the load coupled to the voltage generator, the horizontal deflection circuit is coupled to the vertical deflection circuit by second transformer means separate from the first.

12 Claims, 2 Drawing Figures

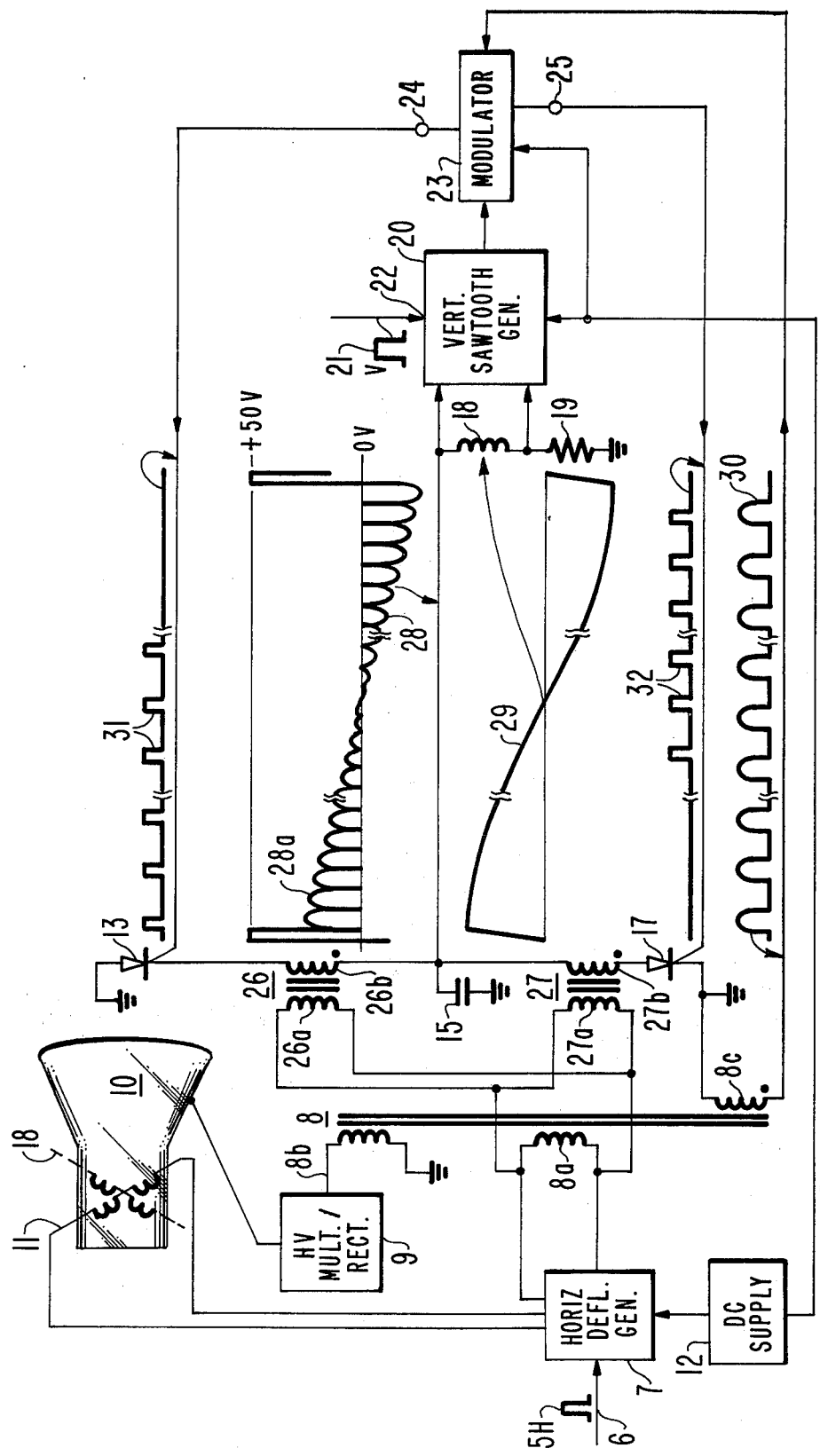

TRANSFORMER ARRANGEMENT FOR SYNCHRONOUSLY SWITCHED VERTICAL DEFLECTION SYSTEM

BACKGROUND OF THE INVENTION

This invention relates to a coupling arrangement between the horizontal and vertical deflection system useful in a television receiver.

A switched synchronous vertical deflection system is described in U.S. Pat. No. 4,048,544, issued Sept. 13, 1977 to Peter Eduard Haferl and entitled "SWITCHED VERTICAL DEFLECTION SYSTEM". In this arrangement, the energy for the vertical deflection system is derived from the horizontal deflection system by means of switched reactances. The switched reactances are coupled to the horizontal deflection generator by means of a transformer, a primary of which is connected to the horizontal deflection generator and at least one secondary of which is connected to the switched reactances. In the aforementioned arrangement of U.S. patent application Ser. No. 595,809, a further secondary winding of the transformer is a high voltage winding from which the kinescope ultor voltage is derived by rectification.

When video is displayed on the kinescope of the television receiver, beam current variations cause a varying load on the secondary winding from which the ultor voltage is derived. These variations in turn cause variations in the magnetic flux in the core of the transformer dependent upon the kinescope beam current. The changes in magnetic flux in the transformer in dependence upon the video content of the information being displayed by the kinescope in turn changes the incremental transformer mutual inductance, due to the nonlinearity of the relationship between magnetizing force and flux in the core. This may result in undesired variations in the coupling of energy between the horizontal deflection generator and the vertical deflection generator with resulting imperfect vertical linearity.

SUMMARY OF THE INVENTION

A television kinescope drive apparatus comprises a horizontal deflection circuit for producing a recurrent horizontal deflection drive signal. A first transformer means having a primary coupled to the horizontal deflection circuit produces power for a load having independent variations. A switched synchronous vertical deflection system coupled to the horizontal deflection generator by second transformer means separate from the first transformer means applies successively smaller portions of the energy of the horizontal drive signal during the first interval of the vertical deflection period and successively larger portions of the energy during the second interval to the kinescope.

DESCRIPTION OF THE DRAWING

The accompanying drawing shows a schematic and block circuit diagram form a switched vertical deflection system embodying the invention.

DESCRIPTION OF THE INVENTION

The drawing shows the essential portions of a synchronous switched vertical deflection system in accordance with the aforementioned U.S. patent application Ser. No. 595,809, now U.S. Pat. No. 4,048,544. Horizontal sync pulses 5 from a synchronizing signal separator, not shown, are coupled to an input terminal 6 of a horizontal deflection generator 7. Horizontal deflection generator 7 may be any suitable type for supplying deflection current to a horizontal deflection winding 11 mounted adjacent to the kinescope 10 as well as supplying horizontal rate pulses for various functions within the television receiver. A primary winding 8a of a horizontal transformer 8 receives energy from generator 7. An ultor generator comprises a secondary winding 8b of transformer 8 and a high voltage multiplier and rectifier assembly 9. The secondary winding 8b supplies retrace pulses to the assembly 9. The ultor generator provides a high direct voltage to the ultor terminal of kinescope 10.

Second and third transformers 26 and 27 have their respective primary windings 26a and 27a each coupled in parallel with primary winding 8a of transformer 8. The respective secondaries 26b and 27b of transformers 26 and 27 have oppositely-phased terminals connected together. The terminal of winding 26b remote from the junction with secondary 27b is connected to the cathode of a thyristor or SCR 13. The anode of thyristor 13 is connected to ground. The end of secondary winding 27b remote from the junction with winding 26b is connected to the anode of a thyristor 17, the cathode of which is connected to ground. The junction of secondary windings 26b and 27b is coupled through a capacitor 15 to ground and also through a vertical deflection winding 18 and a current sampling feedback resistor 19 to ground. The connections from either side of vertical deflection winding 18 to a vertical sawtooth generator 20 provides feedback for controlling the generation of the vertical deflection current.

Vertical deflection rate sync pulses 21 also derived from the sync separator are coupled to an input terminal 22 of the vertical sawtooth generator 20 to synchronize the operation thereof. Output signals obtained from vertical sawtooth generator 20 are coupled to a modulator 23. A source 12 of direct operating voltage is coupled to horizontal generator 7, vertical sawtooth generator 20 and to modulator 23 and supplies operating current thereto.

Horizontal rate pulses obtained from a secondary winding 8c of horizontal transformer 8 are also coupled to modulator 23 for synchronization. Output signals obtained from modulator 23 are coupled through a terminal 24 to the gate electrode of thyristor 13 and through output terminal 25 to the gate electrode of thyristor 17.

While the operation of a synchronous switched vertical deflection system such as that of the drawing is described in detail in the aforementioned U.S. Pat. No. 4,048,544, a short description of the operation follows.

In operation, voltage-time waveforms depicted as 28, 30, 31 and 32 of the drawing appear at various points in the switched synchronous vertical deflection circuit. As a result of these voltage waveforms, a roughly sawtooth current shown as 29 is caused to flow in deflection winding 18 at the vertical deflection rate. Voltage waveforms 30 illustrate horizontal rate retrace pulses such as are obtained at winding 8c of transformer 8 and such as appear across secondary windings 26b and 27b. Pulses 31 are obtained from modulator 23 and are coupled through terminal 24 to the gate electrode of thyristor 13 to enable conduction thereof. Pulses illustrated as 32 are coupled through terminal 25 to the gate electrode of thyristor 17 to enable conduction thereof.

It can be seen that modulator 23 produces output pulses 31 and 32 which have leading edges which vary in time with respect to the leading edges of the retrace pulses 30. The leading edges of pulses 31 are progressively delayed relative to the leading edges of retrace pulses 30. The leading edges of pulses 31 are progressively delayed relative to the leading edges of retrace pulses 30 from the beginning until some time after the center of vertical scan. Pulses 31 cease some time after the center of vertical scan. The leading edges of pulses 32 are continuously advanced relative to the leading edges of retrace pulses 30 from some time before the center until the end of vertical scan.

Thyristor control pulses 31 and 32 of the drawing are shown as having the same width, with the leading and trailing edges varying in time during the vertical interval relative to the leading edges of the horizontal retrace pulses. Such pulses trains can be generated by any suitable pulse-position modulator. The thyristors when utilized as switches are initially gated on by the leading edges of the gate pulses 31 and 32. Turn-off of the thyristors is controlled only by their forward current and not by the gating pulses.

The leading edges of pulses 31 occurring during the first part of the vertical scan interval enable thyristor 13 for conduction. Each of the retrace pulses 30 appearing across winding 26b acts as a voltage source positive at the bottom terminal of winding 26b relative to its top terminal, which provides conventional current flow from the bottom terminal of winding 26b through capacitor 15 to ground, and through thyristor 13 from its anode to cathode to the other terminal of transformer winding 26b. This charges capacitor 15 positive with respect to ground. Thyristor 13 begins to conduct when its gate electrode is forward biased by a pulse 31 and continues to conduct as long as forward current flows in its anode-cathode path.

The leakage inductance of transformer 26 appearing in series with winding 26b forms with capacitor 15 a series resonant circuit for charging capacitor 15. The slope of the increase and decrease of the current through winding 26b is determined by the resonant frequency capacitor 15 and of the leakage inductance in transformer 26 appearing in series with winding 26b. The resonant frequency of the series resonant circuit including capacitor 15 and the leakage inductance associated with winding 26b is chosen to be less than the horizontal deflection frequency. Upon termination of each horizontal retrace pulse, winding 26b is no longer a retrace pulse voltage source but a source of opposite-polarity trace voltage, and consequentially the charging current in the path including winding 26b, thyristor 13 and capacitor 15 decreases. Thyristor 13 turns off when the charging current reaches zero. At this time, the voltage across capacitor 15 has reached an instantaneous maximum as illustrated by one of the serrations such as 28a of voltage waveform 28. At the horizontal rate, the inductance of vertical deflection winding 18 in parallel with capacitor 15 is so large that it has little effect on the above-described resonant charging of capacitor 15.

Deflection current is obtained by discharging capacitor 15 by way of winding 18, which integrates the horizontal rate voltage across capacitor 15 to a substantially sawtooth current 29 at the vertical rate. Due to the large inductance of winding 18, the discharge current cannot follow the roughly triangular horizontal-rate voltage across capacitor 15. Consequently, the current through winding 18 results from the average of the voltage across capacitor 15. Therefore, winding 18 acts as a current sink to discharge capacitor 15. The parallel resonant frequency of capacitor 15 and vertical deflection winding 18 determines the vertical retrace interval.

As the vertical deflection interval proceeds, modulator 23 produces pulses 31 for thyristor 13 which have leading edges increasingly delayed in time relative to the leading edges of the horizontal retrace pulses 30. Hence, the conduction time of thyristor 13 begins later and later relative to the beginning of the horizontal retrace pulse 30. This results in a decreasing charging current through the leakage inductance associated with winding 26b and a decreasing voltage across capacitor 15. The current through deflection winding 18 likewise decreases. The deflection current through winding 18 crosses the zero axis at the center of the vertical scan.

Prior to this time, modulator 23 started producing pulses 32 to enable conduction of thyristor 17. These pulses enable thyristor 17 to conduct in much the same manner as thyristor 13. Thyristor 17 conducts from its anode to cathode to ground and up through capacitor 15 and winding 27b to the top terminal of winding 27b, which has a negative polarity retrace pulse relative to its bottom terminal. Hence, conduction of thyristor 17 charges capacitor 15 in such a polarity as to place the negative charge across capacitor 15 relative to ground. Since thyristor 17 conducts for a longer period than thyristor 13 as determined by the respective gating pulses 31 and 32 after the center of the vertical scan interval, the net voltage across capacitor 15 becomes increasingly negative.

During that period when both thyristors 13 and 17 conduct, only the difference between the current through winding 26b and 27b is available to charge capacitor 15. The remainder of the two currents circulates in a path including thyristors 13 and 17, windings 26b and 27b to ground.

In the arrangement of the FIGURE, energy is coupled from the horizontal deflection generator to the vertical deflection winding by way of transformers 26 and 27 which are independent of transformer 8. Consequently, variations in the flux density in the core of transformer 8 resulting from variations in loading of ultor generator 8b, 9 by video-dependent kinescope beam current variations do not affect the cores of transformers 26 and 27. The coupling of horizontal deflection energy between the horizontal deflection generator and the vertical deflection winding is therefore stabilized against variations due to the displayed video.

The use of the leakage inductance of transformers 26 and 27 to resonate capacitor 15 at a frequency less than the horizontal deflection frequency also provides the advantage of eliminating the need for two separate inductors to perform the resonating function. The cores required for transformers 26 and 27 may be equivalent to the cores required to provide an equivalent resonating inductance. A cost saving is also achieved by comparison with the arrangement of the aforementioned U.S. Pat. No. 4,048,544, because windings of a horizontal output transformer such as transformer 8 cost more than windings from simple transformers. Thus, the price of two separate transformers such as 26 and 27 will be less than the cost of two secondary windings on the horizontal output transformer plus the cost of two inductors having inductance equivalent to the leakage inductance of windings 26b and 27b.

As an additional advantage, the stray magnetic fields of transformers 26 and 27 are less than those due to the resonant charging inductors of the aforementioned U.S.

Pat. No. 4,048,544. This is because the air gap of the transformer core can be smaller than the air gap of the core of an inductor providing a similar inductance, as the total flux in a transformer is less than in a coil. The magnetic radiation due to the transformer with a small air gap can less easily disturb the performance of other circuits sensitive to this kind of stray magnetic radiation.

Other configurations of the inventive coupling arrangement will be apparent to those skilled in the art. For example, transformers 26 and 27 may be wound on a single core with a tapped secondary winding providing the functions of windings 26b and 27b of the drawing. Furthermore, when a plurality of primary windings such as 26a and 27a are used, the primary windings may be connected in series rather than in parallel across the output of the horizontal deflection generator.

In the described embodiment, the independently variable load comprised kinescope beam current variations, and the kinescope ultor is supplied from a rectifier and high voltage winding. It will be clear that the independently variable load could as well be an audio amplifier, for example, supplied by low direct voltage from a low-voltage winding, rectifier and filter.

What is claimed is:

1. A television kinescope drive apparatus comprising:
    a horizontal deflection circuit for producing a recurrent horizontal deflection drive signal;
    power generation means including first transformer means having a primary winding coupled to said horizontal deflection circuit for driving an independently varying load;
    vertical deflection means coupled to said horizontal deflection circuit for applying successively smaller portions of the energy of said horizontal drive signal during a first interval of the vertical deflection period and successively greater portions of the energy of said horizontal deflection drive signal during a second interval of the vertical deflection period to said kinescope by way of second transformer means independent of the first for producing a recurrent vertical-frequency scanning thereof.

2. A television kinescope drive apparatus in accordance with claim 1 wherein a primary winding of said second transformer means is coupled to an output of said horizontal deflection circuit.

3. A television kinescope drive apparatus in accordance with claim 2 wherein a secondary winding of said second transformer means is coupled to said kinescope for coupling said energy of said horizontal drive signal thereto.

4. A television kinescope drive apparatus in accordance with claim 1 wherein said second transformer means couples said energy of said horizontal drive signal to said kinescope by way of capacitance means.

5. A television kinescope drive apparatus in accordance with claim 4 wherein said second transformer means is resonant with said capacitance means at a frequency less than the horizontal deflection frequency.

6. A television kinescope drive apparatus in accordance with claim 4 wherein said second transformer means comprises at least one secondary winding, and the inductance appearing in series with said secondary winding resonates with said capacitance means at resonant frequency.

7. A television kinescope drive apparatus in accordance with claim 6 wherein said resonant frequency less than the horizontal deflection frequency.

8. A television kinescope drive apparatus in accordance with claim 6 wherein said second transformer means includes leakage reactance and wherein said leakage reactance of said second transformer means appearing in series with said second winding resonate with said capacitance means.

9. A television kinescope drive apparatus in accordance with claim 6 wherein said secondary winding coupled with said capacitance means by a first path comprising first switch means operated at the horizontal deflection frequency.

10. A television kinescope drive apparatus in accordance with claim 9 wherein said second transformer means comprises a second secondary winding couple to said capacitance means by a second conducting path comprising second switch means operated at the horizontal deflection frequency.

11. A deflection drive and power supply arrangement for a display transducer, comprising:
    line deflection means for producing recurrent line deflection at a line deflection rate;
    power supply means including first transformer means the primary of which is coupled to an output of said horizontal deflection circuit for supplying power to a varying load;
    field deflection means for applying progressively smaller portions of the energy of said line deflection means to said display transducer during the first part of the field deflection interval and for applying progressively greater portions of the energy of said line deflection means to said display transducer during the second part of the field deflection interval, said energy being coupled from said line deflection means to said display transducer by way of second transformer means independent of said first transformer means.

12. A television kinescope drive apparatus comprising:
    a horizontal deflection circuit for producing a recurrent horizontal deflection drive signal;
    ultor voltage generation means including first transformer means with a first primary winding coupled to said horizontal deflection circuit;
    vertical deflection means for applying successively smaller portions of the energy of said horizontal drive signal during a first interval of the vertical deflection period and successively greater portions of the energy of said horizontal deflection drive signal during a second interval of the vertical deflection period to said kinescope for producing recurrent vertical-frequency scanning thereof;
    wherein that portion of the energy of said horizontal deflection drive signal applied to said vertical deflection means is applied by way of second transformer means including a primary winding independent of said first primary winding.

* * * * *